US008961212B2

(12) United States Patent  
Lin et al.

(10) Patent No.: US 8,961,212 B2  
(45) Date of Patent: Feb. 24, 2015

(54) BURN-IN SOCKET

(71) Applicant: Hon Hai Precision Industry Co., Ltd., New Taipei (TW)

(72) Inventors: Wei-Chih Lin, New Taipei (TW); Hsiu-Yuan Hsu, New Taipei (TW); Ming-Lun Szu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 97 days.

(21) Appl. No.: 13/848,747

(22) Filed: Mar. 22, 2013

(65) Prior Publication Data

US 2013/0252450 A1 Sep. 26, 2013

(30) Foreign Application Priority Data

Mar. 22, 2012 (TW) .............................. 101109935 A

(51) Int. Cl.
*H01R 13/62* (2006.01)
*H05K 7/10* (2006.01)

(52) U.S. Cl.
CPC ....................................... *H05K 7/10* (2013.01)
USPC ........................................... 439/331; 439/330

(58) Field of Classification Search
USPC .................................................. 439/331, 330
See application file for complete search history.

(56) References Cited

U.S. PATENT DOCUMENTS

| 7,278,868 | B2 * | 10/2007 | Sato et al. ..................... 439/331 |
| 7,491,082 | B2 * | 2/2009 | Hsu et al. ...................... 439/330 |
| 7,819,686 | B2 * | 10/2010 | Chen et al. .................... 439/330 |
| 7,878,821 | B2 * | 2/2011 | Chen et al. .................... 439/330 |
| 7,922,512 | B2 * | 4/2011 | Hsiao et al. ................... 439/331 |
| 8,062,043 | B2 * | 11/2011 | Chen et al. .................... 439/266 |
| 8,105,104 | B2 * | 1/2012 | Chen et al. .................... 439/331 |
| 2008/0293285 | A1 * | 11/2008 | Hsieh ............................ 439/331 |
| 2010/0248518 | A1 | 9/2010 | Sensata |

* cited by examiner

*Primary Examiner* — Briggitte R Hammond  
(74) *Attorney, Agent, or Firm* — Wei Te Chung; Ming Chieh Chang

(57) ABSTRACT

A burn-in socket for an IC package includes a base loaded with several terminals, a sliding plate, an actuator and a pair of locking elements. The sliding plate is assembled on the base and defines an upper surface. The actuator is mounted on the base and defines a receiving opening facing the upper surface. The locking elements is assembled on the actuator under a condition that the locking elements rotate inwards to press against the IC package and outwards to release the IC package when the actuator is push downwards in a vertical direction. Each locking element includes a rotating element and a pressing element. The rotating elements rotate in relative to the actuator and the pressing element rotates in relative to the rotating element. The pressing element defines a sliding slot and the rotating element defines a sliding post slidably receiving in the sliding slot.

20 Claims, 5 Drawing Sheets

BURN-IN SOCKET

BACKGROUND OF THE INVENTION

1. Field of the Invention

The present invention relates to a burn-in socket, and more particularly to a burn-in socket mounted on a printed circuit board (PCB) for testing an IC package.

2. Description of Prior Art

Central Processing Unit (CPU) and other electrical package, generally referred to as IC packages, are undergone a test simulating its real working environment so as to make sure its functions from all intended ranges.

A conventional burn-in socket typically comprises a base, a plurality of contacts disposed on the base, latches, a sliding plate for driving the contacts, and an actuator for actuating the latches and the sliding plate. The contact each has a retained portion secured on the base, an elastic portion protruding from the sliding plate and a solder portion. An IC package is positioned at the top space of the sliding plate. When the IC package is inserted, the latches will push IC package downwards with an elastic force and an impulse. The IC package may be destroyed especially due to the impulse.

Thus, there is a need to provide an improved burn-in socket to overcome the above-mentioned problems.

SUMMARY OF THE INVENTION

An object of the present invention is to provide a burn-in socket which does no harm to the IC package.

In order to achieve the object set forth, a burn-in socket for an IC package comprises a base loaded with a plurality of terminals, a sliding plate, an actuator and a pair of locking elements. The sliding plate is assembled on the base and defines an upper surface. The actuator is mounted on the base and defines a receiving opening facing the upper surface. The pair of locking elements is assembled on the actuator under a condition that the locking elements rotate inwards to press against the IC package and outwards to release the IC package when the actuator is push downwards in a vertical direction. Each of the locking elements comprises a rotating element and a pressing element. The rotating elements rotate in relative to the actuator and the pressing element rotates in relative to the rotating element. The pressing element defines a sliding slot and the rotating element defines a sliding post slidably receiving in the sliding slot.

BRIEF DESCRIPTION OF THE DRAWINGS

Other objects, advantages and novel features of the present invention will become more apparent from the following detailed description when taken in conjunction with the accompanying drawings, in which.

DESCRIPTION OF PREFERRED EMBODIMENT

Figure 1:
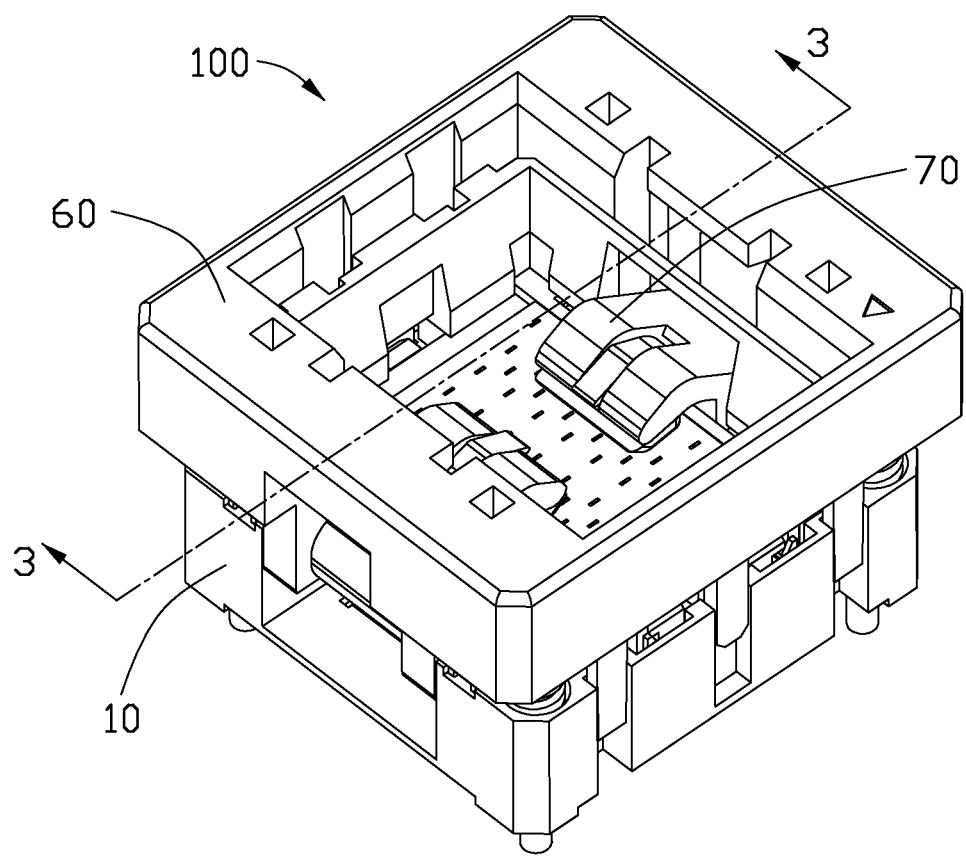
FIG. 1 is an assembled, perspective view of a burn-in socket in accordance with a preferred embodiment of the present invention.
Figure 2:
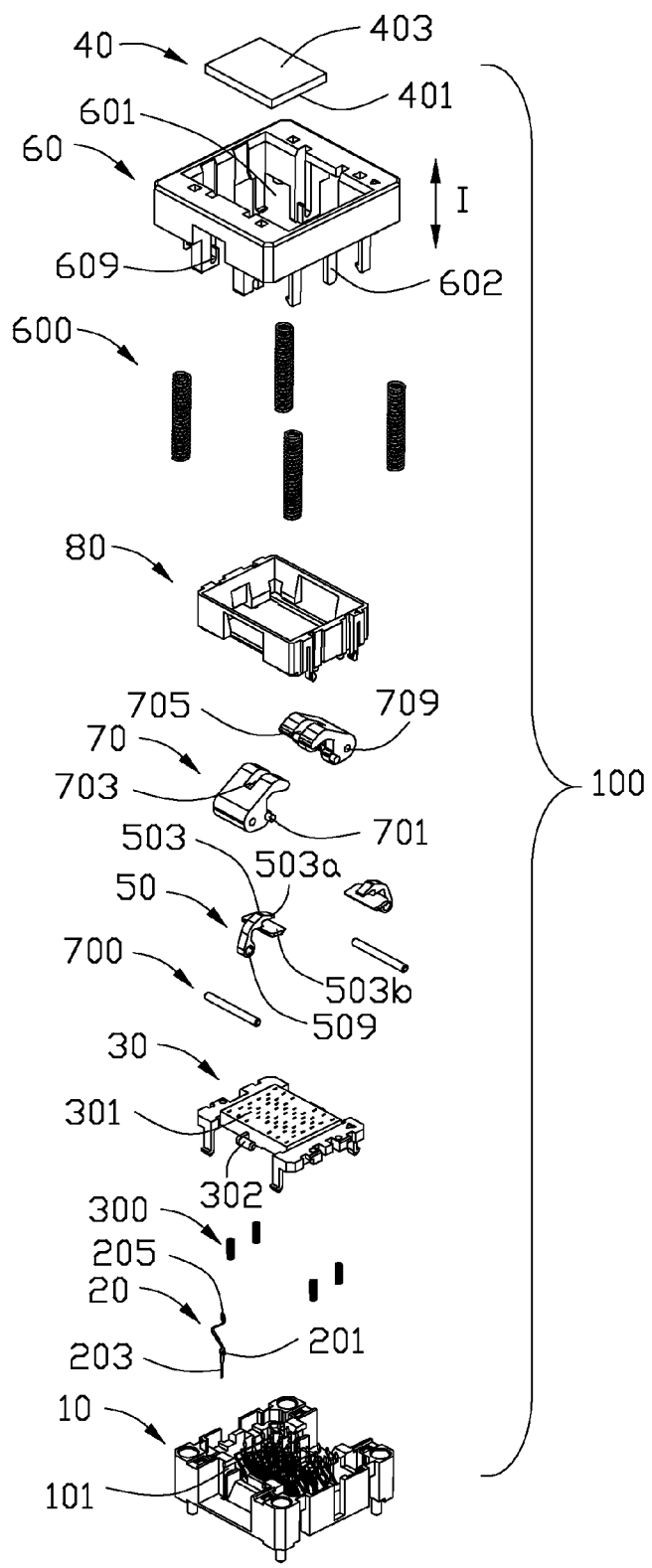
FIG. 2 is an exploded, perspective view of the burn-in socket shown in FIG. 1.
Figure 3:
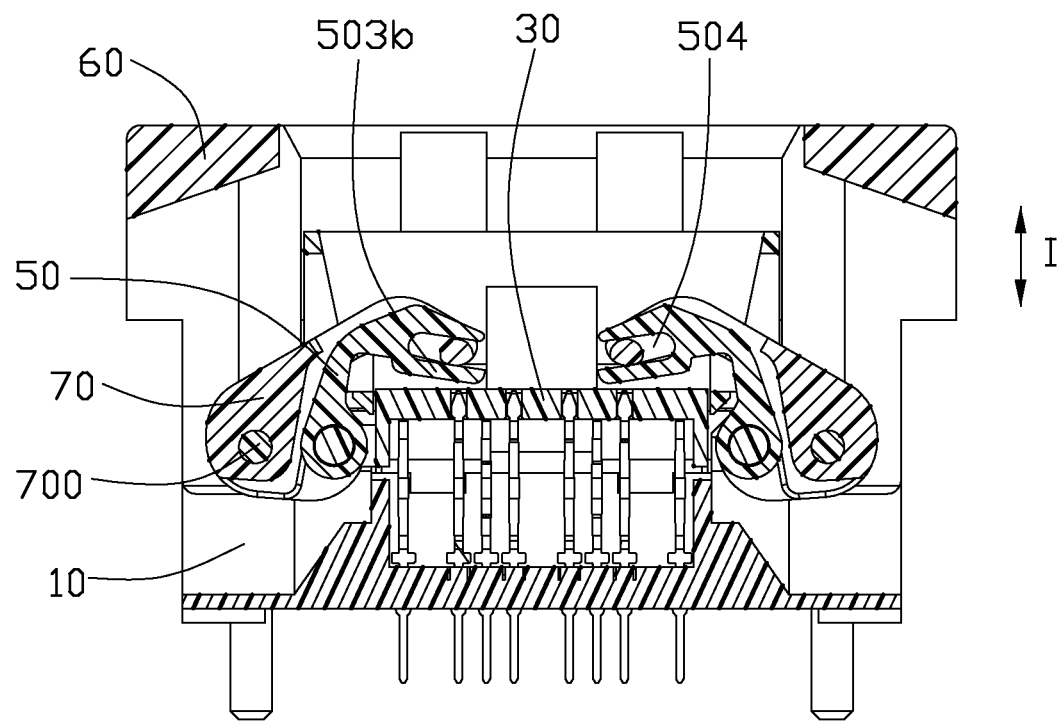
FIG. 3 is a cross-sectional view of an actuator of the burn-in socket taken along lines 3-3 in FIG. 1, wherein the locking elements are closed.

Referring to FIGS. 1-3, a burn-in socket 100 in accordance with a preferred embodiment of the present invention is generally mounted to a printed circuit board (not shown) to receive an IC package 40 (as shown in FIG. 2), to test the IC package 40. The burn-in socket 100 includes a base 10 loaded a plurality of contacts 20 in a vertical direction I with retaining portions 201 retained in the base 10, leg portions 203 extending downwards from the retaining portions and the contacting portions 205 extending upwards from the retaining portions out of an upper face of the base, a sliding plate 30 assembled on the base 10 with an upper face 301 or a supporting face with which a contacting face 401 of the IC package 40 confronts, a pair of locking elements constructing with rotating elements 70 and the pressing element 50 is assembled together to lock the IC package 40, an actuator 60 movably mounted upon the base 2 for driving the sliding plate 30 sliding in a vertical direction. When the sliding plate 30 is actuated downwards, its bottom surface presses the contacting portions 205 with top ends of the contacting portions 205 protruding from the top face of the sliding plate 30. The pressing elements 50 rotate to press against an opposite face 403 of the IC package 40, and the rotating elements 70 are assembled with the base 10. Besides, a plurality of springs 600 are provided between the actuator 60 and the base 10 so as to restore the rotate elements 70 to an original statue. The sliding plate 30 is supported by several springs 300 in the vertical direction.

Referring to FIGS. 2 and 3, the contacting portions 205 project in the sliding plate 30 when the sliding plate 30 is assembled on the base. The actuator 60 defines a receiving opening 601 through which the IC package 40 is inserted, and a plurality of guiding posts 602 through which the actuator 60 is assembled to the base 10. A guiding frame 80 is retained in the receiving opening 60 for guiding the IC package 40. The upper face 301 of the sliding plate 30 faces to the receiving opening 601 and move upwards and downwards in the vertical direction I.

The rotating elements 70 are assembled on the actuator 60 by a pair of post shafts 700, wherein the post shafts 700 go through shaft holes 709 on the rotating elements 70 and then are fixed in corresponding slots 609 on the actuator 60 collectively. The shaft holes 509 couple with a pair of shafts 302 at a lateral side of the sliding plate. So the rotating elements 70 could rotate around the shafts 70 and the pressing elements 50 could rotate around the shaft 302. The post shafts 700 with relative to the base 10. The rotating elements 70 further define shoulders 701, which are received in the slot 101 thereby allowing the rotating elements slide inwards and outward. When the actuator 60 moves downwards, the actuator 60 actuates the rotating elements 70 rotate outward or inwards, the shoulders 701 limit movement of the rotating elements 70 in a predetermined scope. Each rotating element 70 defines a groove 703 extending along a center line thereof and a shaft shape pressing post 705 laterally disposed in the groove 703. The pressing element 50 are assembled to the rotating element 70 by the post shaft 700 so that the pressing elements 50 are received in the grooves 703 of the rotating elements 70 and rotate around the post shafts 700 with relative to the base 10.

Combination with FIGS. 2-5, each pressing element 50 defines a fork end 503 with a sliding slot 504 at a distal end thereof, the pressing post 705 of the rotating element 70 is just received in the slit 504 of the fork end. The fork end is formed with an upper portion 503a and a lower portion 503b, the lower portion has a larger bottom face 5032 which extends beyond the lateral sides of the upper portion 503a. The sliding slot 504 is defined by the upper and lower portions of the fork end 503. The lower portion 503b defines an upper face 5031 opposite to the bottom face 5032, the upper face 5031 is functioned as a first sliding face and the bottom face 5032 is functioned as a second sliding face. During the pressing posts 705 press against the upper face 5031 (the first sliding face) of the lower portion 503b in response to the actuator 60 actuates the rotating element 70. When the actuator 60 is pushed downwards by a user and actuates the post shaft 700 move downwards, the rotating element 70 will rotate outwards limited by the shoulder 701 due to lever principle. When the pushing force is removed, the springs 600 drive the actuator 60 to reset and the rotating elements are closed.

Figure 4:
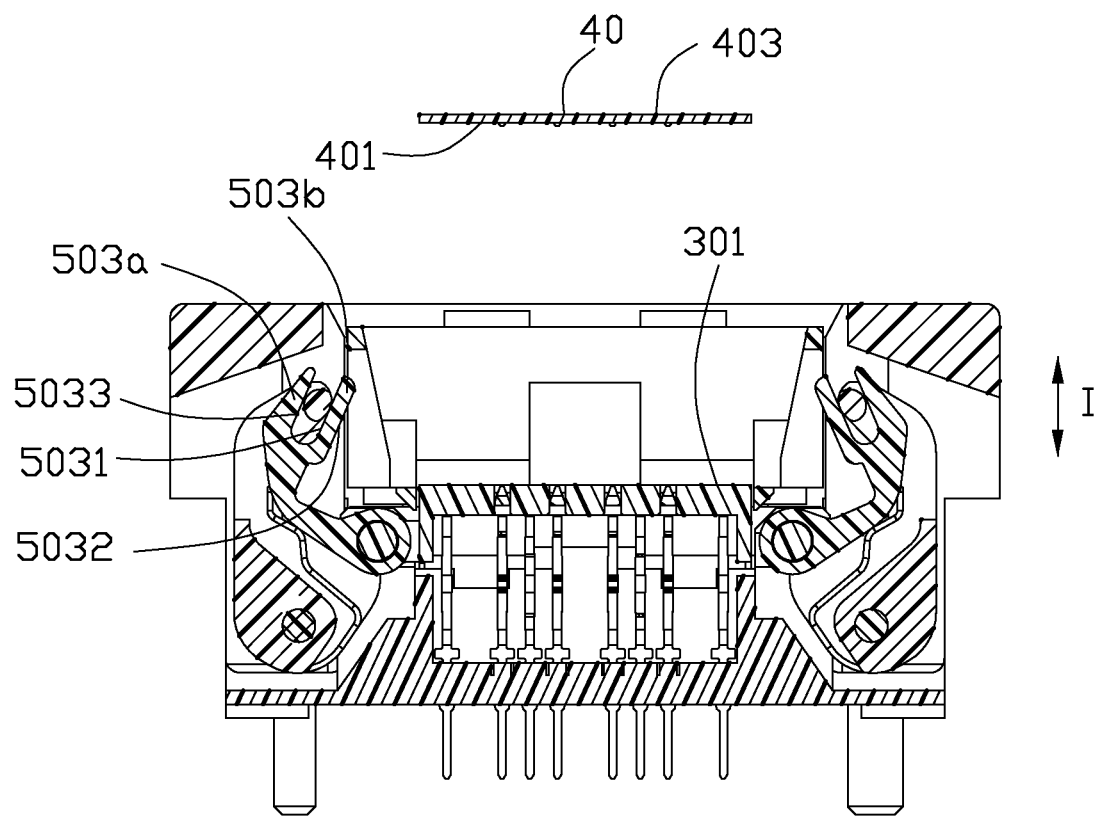
FIG. 4 is similar to FIG. 3, wherein the locking elements are opened to be inserted with an IC package.
Figure 5:
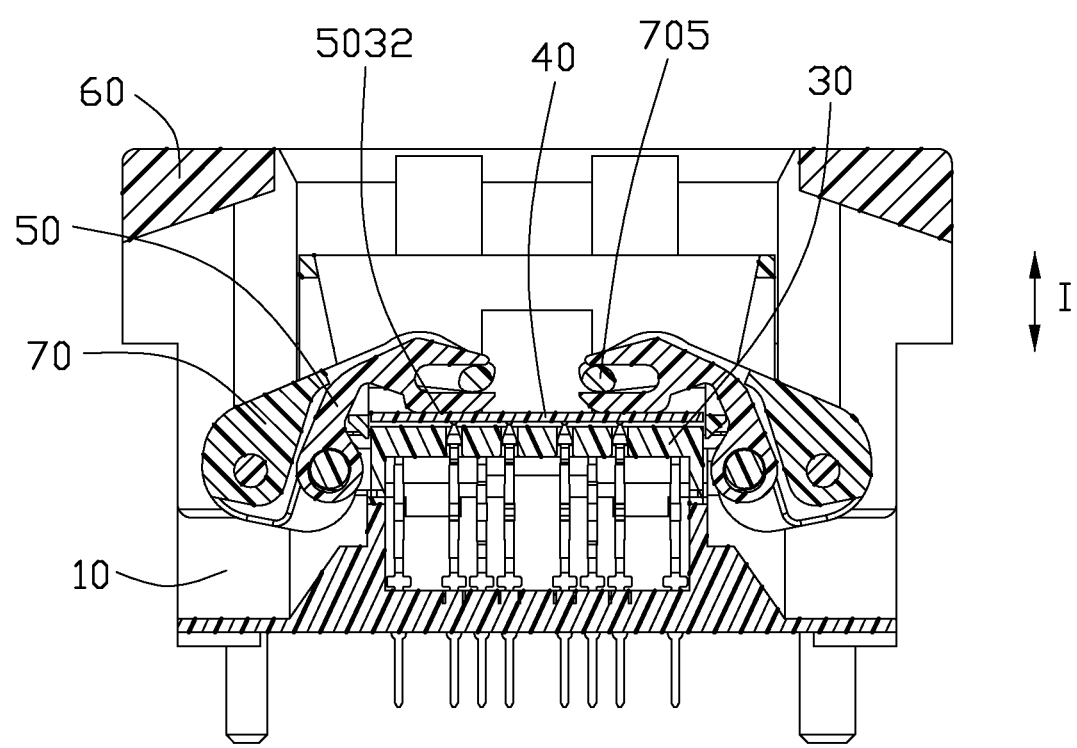
FIG. 5 is similar to FIG. 3, wherein the IC package is locked by the locking elements in the socket.

Referring to FIG. 3 showing an original statue before the IC package 40 is inserted, the locking element including the rotating elements 70 and the pressing elements 50 are rotated inwards in an original condition. The fork ends 503 especially the lower portions 503b of the pressing elements 50 are apart from the sliding plate 30 because of the shoulders 701. Referring to FIG. 4 showing that the rotating elements 70 together with the pressing elements 50 rotates outwards in an opened statue wherein the upper surface 301 of the sliding plate 30 exposes to the receiving opening 601, the IC package 40 is inserted through the receiving opening in the vertical direction I. Referring to FIG. 5 showing a closed statute wherein the IC package is loaded at the upper surface 301 of the sliding plate 30 to engage with the contacting portions of the terminals. When the actuator 60 is restored, the rotating elements 70 are restored inwards wherein the pressing posts 705 slide inwards and push the pressing elements 50 rotates inwards, the lower face (first sliding face) 5031 push the sliding plate 30 downward thereby the contacting portions of the terminals 20 exposing to contact with the pads of the IC packages 40. The bottom face 5032 of the lower portion 503b is parallel to the sliding plate 30. What's more, when the IC package 40 is located between the lower portion 503b and the sliding plate 30, the lower portion 503b, IC package 40 and the sliding plate are in a relative rest condition. There is no friction among the three components, which will never destroy IC package. Even any relative motion exist, it does little harm to IC package because of surface contact between IC package 40 and the lower portion 503b.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A burn-in socket for an IC package, comprising:
a base loaded with a plurality of terminals;
a sliding plate assembled on the base and defining an upper surface;
an actuator mounted on the base and defining a receiving opening facing the upper surface;
a pair of locking elements assembled on the actuator under a condition that the locking elements rotate inwards to press against the IC package and outwards to release the IC package when the actuator is push downwards in a vertical direction;
wherein each of the locking elements comprises a rotating element and pressing element, the pressing element is actuated to press against the IC package in response to rotation of the rotating element relative to the actuator, the pressing element defines a sliding slot and the rotating element defines a sliding post slidably receiving in the sliding slot.

2. The burn-in socket as claimed in claim 1, wherein the pressing element defines a bottom surface confronting with the IC package.

3. The burn-in socket as claimed in claim 1, wherein the pressing element defines a fork end at a distal end thereof, the fork end comprises an upper portion, a lower portion, the sliding slot is defined between the upper and lower portions, the bottom face is larger than the upper portion.

4. The burn-in socket as claimed in claim 2, wherein the bottom surface is parallel to the IC package when the IC package is inserted.

5. The burn-in socket as claimed in claim 1, wherein the rotating element defines a groove and the pressing element is received in the groove, the rotating element and the pressing element are pivoted to the actuator by a post shaft at a bottom end thereof.

6. A burn-in socket for use with an IC package comprising:
an insulative base;
a plurality of contacts disposed in the base;
a plate mounted upon the base;
an actuator mounted upon the base, and back and forth moveable vertically relative to the base in a vertical direction; and
a pair of locking elements each including a rotating element pivotally mounted to the actuator, and a pressing element pivotally mounted to the plate and actuated by the rotating element for downwardly pressing the IC package; wherein
the rotating element and the pressing element are assembled with each other via a mechanism allowing therebetween a relative movement both rotationally and linearly.

7. The burn-in socket as claimed in claim 6, wherein said mechanism includes a sliding post moving along and within a sliding slot.

8. The burn-in socket as claimed in claim 7, wherein said sliding post is formed on the rotating element, and said sliding slot is formed in the pressing element.

9. The burn-in socket as claimed in claim 6, wherein each of the rotating element is assembled to the base via another mechanism allowing therebetween a relative movement both rotationally and linearly.

10. The burn-in socket as claimed in claim 9, wherein said another mechanism includes a shoulder movable along a transverse slot.

11. The burn-in socket as claimed in claim 10, wherein said shoulder is formed on the rotating element, and the horizontal slot is formed in the base.

12. The burn-in socket as claimed in claim 6, wherein the pressing element is located inside with regard to the rotating element.

13. The burn-in socket as claimed in claim 6, wherein said plate is back and forth moveable relative to the base in said vertical direction.

14. A burn-in socket for use with an IC package comprising:
an insulative base;
a plurality of contacts disposed in the base;
an actuator mounted upon the base, and back and forth moveable vertically relative to the base in a first direction; and
a pair of locking elements each including a rotating element pivotally mounted to the actuator, and a pressing element defining a pivot in a fixed position relative to the base, said pressing element actuated by the rotating element for downwardly pressing the IC package; wherein
the rotating element and the pressing element are assembled with each other via a mechanism allowing therebetween a relative movement both rotationally and linearly.

15. The burn-in socket as claimed in claim 14, wherein said mechanism includes a sliding post moveable along and within a sliding slot.

16. The burn-in socket as claimed in claim 15, wherein said sliding post is formed on the rotating element, and said sliding slot is formed in the pressing element.

17. The burn-in socket as claimed in claim 14, wherein each of the rotating element is assembled to the base via another mechanism allowing therebetween a relative movement both rotationally and linearly.

18. The burn-in socket as claimed in claim 17, wherein said another mechanism includes a shoulder movable along a transverse slot.

19. The burn-in socket as claimed in claim 14, wherein said pressing element is located inside of the rotating element.

20. The burn-in socket as claimed in claim 14, wherein the pressing element is pivotally mounted to a plate which is mounted upon the base with a vertical relative movement therebetween.

\* \* \* \* \*